United States Patent
Shitagaki et al.

(10) Patent No.: US 7,531,847 B2
(45) Date of Patent: May 12, 2009

(54) LIGHT EMITTING DEVICE HAVING ORGANIC LIGHT-EMITTING ELEMENT

(75) Inventors: Satoko Shitagaki, Atsugi (JP); Satoshi Seo, Kawasaki (JP); Takeshi Nishi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 10/740,513

(22) Filed: Dec. 22, 2003

(65) Prior Publication Data
US 2004/0245541 A1 Dec. 9, 2004

(30) Foreign Application Priority Data
Dec. 26, 2002 (JP) .............................. 2002-378493

(51) Int. Cl.
*H01J 63/04* (2006.01)
(52) U.S. Cl. ........................................ 257/100; 257/40
(58) Field of Classification Search .................... 257/40, 257/81, 98–100; 315/169.2, 169.3; 345/204
See application file for complete search history.

(56) References Cited

U.S. PATENT DOCUMENTS

| | | | | |
|---|---|---|---|---|
| 4,550,073 | A | * | 10/1985 | Neiss et al. ............... 430/273.1 |
| 5,882,761 | A | | 3/1999 | Kawami et al. |
| 6,548,960 | B2 | | 4/2003 | Inukai |
| 6,756,740 | B2 | | 6/2004 | Inukai |
| 2002/0033664 | A1 | | 3/2002 | Kobayashi |
| 2002/0047555 | A1 | * | 4/2002 | Inukai ........................ 315/169.3 |
| 2002/0050786 | A1 | * | 5/2002 | Yamazaki et al. ............ 313/504 |
| 2002/0074936 | A1 | * | 6/2002 | Yamazaki et al. ............ 313/504 |
| 2002/0077251 | A1 | * | 6/2002 | Okusako et al. .............. 502/350 |
| 2002/0134979 | A1 | * | 9/2002 | Yamazaki et al. ............... 257/59 |

(Continued)

FOREIGN PATENT DOCUMENTS

CN 1068437 7/2001

(Continued)

OTHER PUBLICATIONS

C.W. Tang et al., "Organic Electroluminescent Diodes," Appl. Phys. Lett. 51 (12), Sep. 21, 1987, pp. 913-915.

(Continued)

*Primary Examiner*—Thomas L Dickey
(74) *Attorney, Agent, or Firm*—Eric J. Robinson; Robinson Intellectual Property Law Office, P.C.

(57) ABSTRACT

In a sealing method of a top-emission organic light emitting element, in the case of using a method of filling with a sealing agent between a substrate mounted with pixels and an opposed substrate, the organic light-emitting element is degraded by ultraviolet rays when irradiation of the ultraviolet rays is performed toward the pixels in order to achieve ultraviolet curing of the sealing agent filling on the pixels. It is an object of the present invention to propose a method for avoiding this phenomenon to provide an organic light-emitting device with superior stability. In order for a sealing agent 13 filling on a pixel portion 14 to have a larger absorbance to ultraviolet rays, an ultraviolet-absorbent material is dispersed in a sealing agent to make an adjustment so that the absorbance of ultraviolet absorption wavelength of 400 nm or less becomes 1 or more.

14 Claims, 7 Drawing Sheets

U.S. PATENT DOCUMENTS

| | | | |
|---|---|---|---|
| 2004/0004434 A1* | 1/2004 | Nishi et al. | 313/506 |
| 2005/0151454 A1* | 7/2005 | Yabuki | 313/112 |

FOREIGN PATENT DOCUMENTS

| | | |
|---|---|---|
| CN | 1323023 | 11/2001 |
| EP | 1 111 574 | 6/2001 |
| EP | 1 191 823 | 3/2002 |
| JP | 04-212284 | 8/1992 |
| JP | 04-267097 | 9/1992 |
| JP | 06-176867 | 6/1994 |
| JP | 08-213173 | 8/1996 |
| JP | 09-148066 | 6/1997 |
| JP | 11-040344 | 2/1999 |
| JP | 2000-150145 | 5/2000 |
| JP | 2000-223271 | 8/2000 |
| JP | 2001-126868 | 5/2001 |
| JP | 2001-357973 | 12/2001 |
| JP | 2003-109751 | 4/2003 |
| JP | 2003-243161 | 8/2003 |
| WO | WO 01/63975 | 8/2001 |

OTHER PUBLICATIONS

International Search Report dated Feb. 3, 2004, Application No. PCT/JP03/16031.

Office Action (Application No. 200380107492.4) Dated Mar. 28, 2008.

* cited by examiner

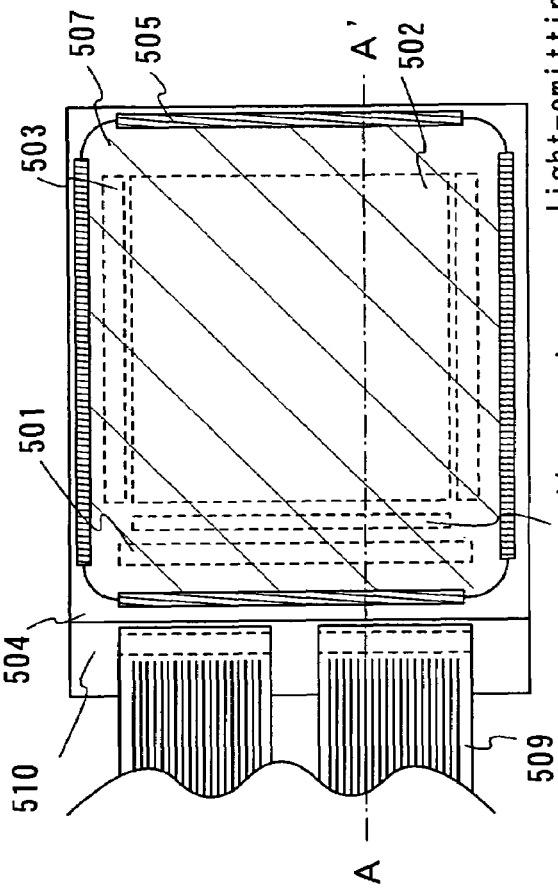
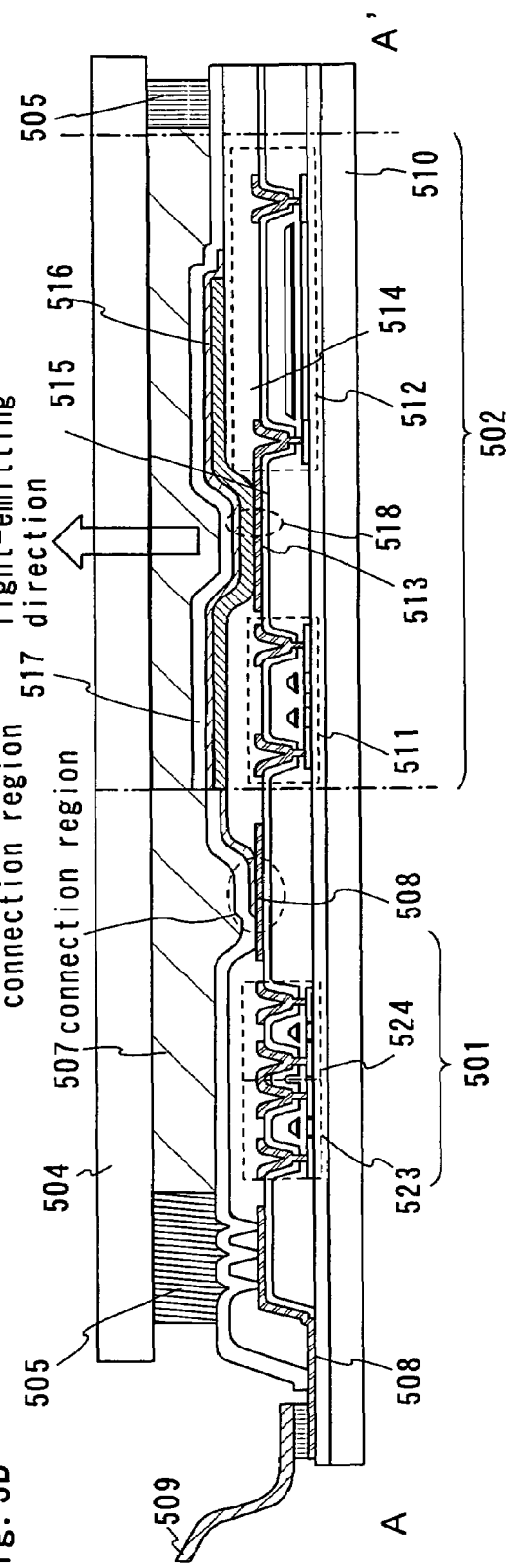
Fig. 5A
Fig. 5B

LIGHT EMITTING DEVICE HAVING ORGANIC LIGHT-EMITTING ELEMENT

TECHNICAL FIELD

The present invention relates to a light-emitting device that has an organic light-emitting element using an electroluminescent organic compound, and to an electronic equipment mounted with the light-emitting device as a part.

BACKGROUND ART

Recently, a light-emitting element using a material that emits light (electroluminescence) by applying an electric field (hereinafter, referred to as "EL material") has been actively researched as a self light-emitting element. In particular, an element using an organic compound as the EL material (hereinafter, referred to as "organic light-emitting element") has been attracting attention. Further, various light-emitting devices using the organic light-emitting element has been proposed, which is expected to be applied to displays.

An organic light-emitting element has a structure in which a layer including an electroluminescent organic compound (hereinafter, referred to as "organic light-emitting layer") is interposed between an anode and a cathode, and has an emission mechanism in which, by applying a voltage between electrodes, an electron injected from a cathode and a hole injected from an anode are recombined in the electroluminescent layer to form a molecule in an excited state (hereinafter, referred to as an excited molecule), and energy is released to emit light while the excited molecule moves back toward the ground state. The foregoing light emission from the excited molecule is referred to as luminescence.

Luminescence in an organic compound includes luminescence during moving back to a ground state from a single excited state (fluorescence) and luminescence during moving back to a ground state from a triplet excited state (phosphorescence), and the specification includes a case of using either luminescence.

In the organic light-emitting element, the organic light-emitting layer generally has a laminated structure. Typically, a laminated structure of "a hole transport layer/a light-emitting layer/an electron transport layer" can be given (refer to Non-Patent Document 1). This structure has a quite high luminous efficiency, and organic light-emitting elements for which research and development has been advanced presently are mostly constructed based on this structure.

(Non-Patent Document 1)
C. W. Tang et al., Applied Physics Letters, vol. 51, No. 12, 913-915 (1987)

In addition, a structure in which 'a hole injection layer/a hole transport layer/a light-emitting layer/an electron transport layer' or 'a hole injection layer/a hole transport layer/a light-emitting layer/an electron transport layer/an electron injection layer' are in sequence laminated on anode is suggested. Further, a method such as doping a light-emitting layer with a fluorescent pigment is also proposed. Besides, materials that are used for these layers include a low molecular weight material and a high molecular weight material (polymer), and the low molecular weight material is deposited mainly by vacuum deposition while a high molecular weight material is deposited by a wet coating method.

Since all layers provided between a cathode and an anode are collectively called an organic light-emitting layer in the specification, the above-mentioned hole injection layer, hole transport layer, light-emitting layer, electron transport layer, electron injection layer are all included in the organic light-emitting layer.

In the case of applying the organic light-emitting element as described above to a light-emitting device, particularly, to a use for displaying such as a display, it is a feature that there is no problem with a viewing angle unlike a liquid crystal display device. In other words, the light-emitting device is more appropriate as a display for outdoor use than a liquid crystal display, and uses in various forms are proposed.

The mode of a display includes a mode in which an organic light-emitting layer is formed between two-kinds of stripe-shaped electrodes provided to be mutually perpendicular (a simple matrix mode) and a mode in which an organic light-emitting layer is formed between a pixel electrode connected to a TFT (thin film transistor) and arranged in a matrix shape and an opposed electrode (an active matrix mode), in addition to a segment. In the case of a pixel density increased, the active matrix mode that has a switch provided with respect to each pixel (or 1 dot) has an advantage since driving at a lower driving voltage is possible as compared to the simple matrix mode.

By the way, in the above-mentioned organic light-emitting element, a material composing the organic light-emitting layer easily oxidizes or absorbs moisture due to an existence of oxygen or water to degrade, which results in a problem that the luminance of the organic light-emitting element lowers with time.

There, an arrival of oxygen or an arrival of moisture at an organic light-emitting element is prevented conventionally by a method of providing a protective case around an organic light-emitting element and filling fine powder of a solid dehydrating agent in the case (refer to Patent Document 1) or a method of encapsulating an organic light-emitting element in an airtight container formed of a sealing can or the like and attaching a desiccant to be away from the element (Patent Document 2).

(Patent Document 1)
Japanese Patent Laid-Open 6-176867

(Patent Document 2)
Japanese Patent Laid-Open 9-148066

DISCLOSURE OF INVENTION

Problem to be Solved by the Invention

In a structure of a light-emitting device that uses a conventional organic light-emitting element, there is an organic light-emitting element where an anode that is an electrode with transparency is formed on a substrate, an organic light-emitting layer is formed on the anode, a cathode is formed on the organic light emitting layer, and light generated in the organic light-emitting element is taken from the anode toward to the substrate (hereinafter, referred to as a bottom-emission structure). In the bottom-emission structure, it is possible to put a sealing can over the light-emitting element in order to prevent oxygen moisture, or the like from arriving at the organic light-emitting element. Even if the organic light-emitting element is covered with a sealing can formed of a material that shields light, displaying can be carried out without problems since light generated in the organic light-emitting layer is taken from the side of the substrate covered with no sealing can.

On the other hand, in a light-emitting device of a structure that has an organic light-emitting element where an anode is formed on a substrate, an organic light-emitting layer is formed on the anode, and a cathode that is an electrode with transparency such as a transparent electrode is formed on the organic light-emitting element, where light generated in the organic light-emitting layer is taken from the cathode (hereinafter, referred to as a top-emission structure), in order to prevent oxygen moisture, or the like from arriving at the organic light-emitting element, it is not possible to apply the structure of covering the organic light-emitting element with a sealing can formed of a material that shields light. This is because, when the organic light-emitting element is covered with a sealing can formed of a material that shields light, displaying cannot be carried out since light generated in the organic light-emitting layer is obscured by the sealing can. Further, in the top-emission structure, displaying is disturbed when a desiccant is disposed over a light-emitting portion (hereinafter, referred to as a 'pixel portion') as Patent Document 2.

In the top-emission structure, for preventing oxygen, moisture, or the like from arriving at an organic light-emitting element, in a structure where another substrate is bonded to the substrate that has the organic light-emitting element formed to dispose the organic light-emitting element in a region sandwiched between these two substrates to prevent oxygen, moisture, or the like from arriving at the organic light-emitting element, there is a problem that irradiated ultraviolet is irradiated also to the organic light-emitting element to degrade the organic light-emitting element in the case of curing a sealing agent for bonding the two substrates by ultraviolet radiation.

However, the top-emission structure can improve a light-extraction efficiency and enhance a luminous efficiency as compared to the bottom-emission structure, and is a quite useful structure. In addition, in the case of being applied to an active matrix light-emitting device, there is an advantage that an aperture ratio can be improved since it becomes possible to make a portion of the light-emitting element, overlapping over a TFT arranged in a pixel, contribute to displaying, as compared to the bottom-emission structure.

Consequently, it is an object of the present invention to provide a structure that is appropriate for a top-emission structure to prevent oxygen, moisture, or the like from arriving at an organic light-emitting element (sealing structure) in a light-emitting device using an organic light-emitting element that has a top-emission structure.

Means for Solving the Problem

The inventors have found that the object can be achieved by applying the following sealing structure in a light-emitting device using an organic light-emitting element that has a top-emission structure.

In other words, in the present invention, a light-emitting device that has an organic light-emitting element of a sequential lamination of a first electrode provided in contact with an insulating surface of a first substrate, an organic light-emitting layer provided in contact with the first electrode and including an electroluminescent organic compound, and a transparent second electrode provided in contact with the organic light-emitting layer, which is provided between the first substrate and a translucent second substrate, is characterized in that a sealing agent of an ultraviolet absorbent dispersed in an ultraviolet curable resin is filled between the second electrode and the second substrate and the sealing agent has an absorbance of 1 or more to a wavelength of ultraviolet rays irradiated for curing the ultraviolet curable resin.

The ultraviolet absorbent indicates a material that absorbs the wavelength region of the ultraviolet rays. It is more preferable that the ultraviolet absorbent is moisture-adsorbent or oxygen-absorbent in order to prevent oxygen or moisture from arriving at an organic light-emitting element.

In addition, a porous material impregnated with an ultraviolet-absorbent material may be used as a moisture-absorbent ultraviolet absorbent. In this case, entering moisture can be adsorbed in a hole while ultraviolet is absorbed, which is efficient. Further, in this case, zeolite is preferable as the porous material.

The light-emitting device in the present invention indicates a light-emitting device and an image display device that use an organic light-emitting element. In addition, a module that has a connecter such as an anisotropic conductive film (ACF: Anisotropic Conductive Film), a TAB (Tape Automated Bonding) tape, or a TCP (Tape Carrier Package) attached to an organic light-emitting element, a module that has a printed wiring board provided at the tip of a TAB tape or a TCP, and a module that has an organic light emitting element directly mounted with an IC (integrated circuit) by a COG (Chip On Glass) method are all included in the light-emitting device.

EFFECT OF THE INVENTION

In a light-emitting device according to the present invention, a periphery of an organic light-emitting element disposed between a first substrate and a second substrate is covered with a sealing agent of an ultraviolet absorbent dispersed in an ultraviolet curable resin. In a process of bonding the first substrate and the second substrate (sealing process), ultraviolet rays irradiated in curing the ultraviolet curable resin are shielded by the dispersed ultraviolet absorbent in a layer of the filled sealing agent so that no ultraviolet rays arrive at the organic light-emitting element. Therefore, degradation of the organic light-emitting element is prevented. In this way, the light-emitting element that has the organic light-emitting element with stable characteristics can be provided.

In addition, the effect of the sealing agent, preventing penetration of moisture or oxygen, can further enhanced by making the ultraviolet absorbent moisture-adsorbent or oxygen-absorbent.

By implementing the present invention, in a light-emitting device using an organic light-emitting element that has a top-emission structure, it is possible to obtain a light-emitting device that is able to prevent oxygen, moisture, and the like from arriving at an organic light-emitting element without disturbing displaying. In this way, the light-emitting device using the organic light-emitting element that has a sealing structure appropriate for a top-emission structure.

BRIEF DESCRIPTION OF DRAWINGS

FIG. 5 is a diagram showing a structure of an active matrix light emitting device in Embodiment 2.

BEST MODE FOR CARRYING OUT THE INVENTION

Embodiment Mode 1

Figure 7:
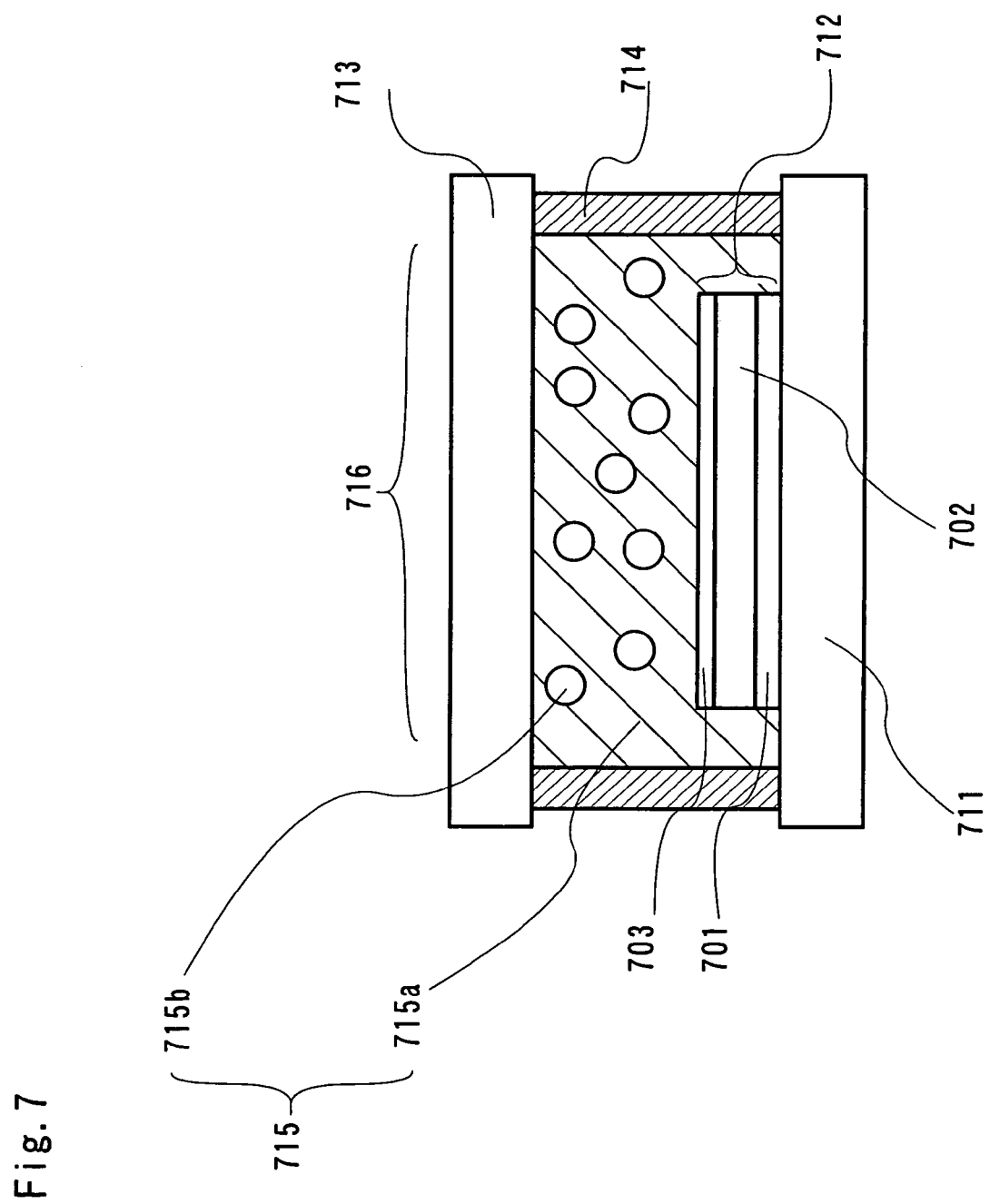
FIG. 7 is a diagram showing a sectional structure of a top-emission device.

First, a form of a light-emitting device according to the present invention will be described with reference to FIG. 7. FIG. 7 has a structure in which a substrate (first substrate) 711 that has an organic light-emitting element 712 provided and an opposed substrate with transparency (second substrate) 713 are bonded, where the organic light-emitting element 712 comprises a first electrode 701, an organic light-emitting layer 702, and a second electrode with transparency 703. In bonding the substrate 711 and the opposed substrate 713, a region of a pixel portion 716 is covered with a second sealing agent with transparency 715, and the periphery is surrounded by a first sealing agent (which has a higher viscosity than the second sealing) including a gap material (such as a filler a fine particle) keeping an distance between the substrates. In other words, the structure is sealed with the first sealing agent 714 and the second sealing agent 715. As a content of the second sealing agent 715, an ultraviolet absorbent 715b dispersed in an ultraviolet curable resin 715a is used. In the present invention, the first sealing agent 714 may be provided or may not be provided. However, it is preferable to use that the sealing agent 714 in order to obtain an uniform sealing figure.

The organic light-emitting element 712 is shielded from the air by filling the second sealing agent 715 over a pixel, an arrival of oxygen or an arrival of moisture can be prevented without encapsulating a desiccant. By this structure, sealing with transparency is realized. Further, since the second sealing agent 715 is adjusted to have an absorbance of 1 or more to a wavelength of ultraviolet rays, it is possible to prevent degradation of the organic light-emitting element 712 of the pixel due to ultraviolet rays to be irradiated in curing the second sealing agent 715 over the pixel.

The ultraviolet absorbent absorbs ultraviolet rays to convert into thermal energy and the like within a molecule. The ultraviolet absorbent is typified by a material that has a basic structure of an intramolecular hydrogen bond formed. In this case, an atom with an unshared electron pair such as an oxygen atom or a nitrogen atom exists near a hydroxyl group in a molecule, a ring is formed due to a hydrogen bond between the hydroxyl group and the atom with the unshared electron pair. When the ring is formed, hydrogen is extracted from the hydroxyl group become a keto molecule while heat is released to become a stable structure.

Embodiment Mode 2

The second sealing agent according to the present invention (715 in FIG. 7) will be described.

The second sealing agent has an ultraviolet absorbent dispersed in an ultraviolet curable resin in order to prevent ultraviolet rays to be irradiated from arriving at an organic light-emitting element.

As a method for preventing ultraviolet rays from arriving at an organic light-emitting element, there is also a method of forming a film over an organic light-emitting element as a layer shielding ultraviolet rays. However, it is difficult that to evaporate an inorganic ultraviolet-absorbent material (such as zinc oxide) by resistance heating, and deposition with a high-energy power source is necessary. In addition, since a high-energy particle collides with a substrate during evaporation, a manufactured organic light-emitting element is damaged. Although an ultraviolet-absorbent material exists also in organic materials, there is concern about deterioration of the ultraviolet absorbent itself in absorbing ultraviolet rays in the case of a filmy state, as known in dimerization of benzophenone known as a typical ultraviolet absorbent. Therefore, the form of the present invention, dispersion into the second sealing agent, is effective.

It is enough that the dispersed is ultraviolet-absorbent, and it is more preferable to have in combination a characteristic of adsorbing moisture or oxygen that is considered to have a bad influence on characteristics of an organic light-emitting element. Besides, the dispersed material may be used singularly, or two kinds or more may be used together.

The second sealing agent is made to have an absorbance of 1 or more to a wavelength of ultraviolet rays. In order to have the absorbance of 1 or more, the ultraviolet absorbent has an added concentration increased or a cell gap has a thickness increased to make an adjustment.

The ultraviolet absorbent includes benzotriazole-based, benzophenone-based, and salicylate-based compounds, for example.

Further, since a photo-polymerization initiator for an ultraviolet curable resin functions also as an ultraviolet absorbent, the ultraviolet curable resin functions also as an ultraviolet absorbent.

As long as the ultraviolet absorbent has the structural moiety as above in a molecule, a substituent may be changed. Further, the ultraviolet absorbent may have one kind or more of the structural moieties in combination. Besides, the ultraviolet absorbent may be used singularly, or two kinds or more may be used together A benzotriazole-based ultraviolet absorbent includes 2-(5-methyl-2-hydroxyphenyl) benzotriazole, 2-[2-hydroxy-3,5-bis(α,α-dimethylbenzil) phenyl]-2H-benzotriazole, 2-(3,5-di-t-butyl-2-hydroxyphenyl) benzotriazole, 2-(3-t-butyl-5-methyl-2-hydroxyphenyl)-5-chlorobenzotriazole, 2-(3,5-di-t-butyl-2-hydroxyphenyl)-5-chlorobenzotriazole, 2-(3, 5-di-t-acyl-2-hydroxyphenyl) benzotriazole, and 2-(2'-hydroxy5'-t-octylphenyl) benzotriazole.

A benzophenone-based ultraviolet absorbent includes 2,4,-dihydroxybenzophenone, 2-hydroxy-4-methoxybenzophenone, 2-hydroxy-4-methoxybenzophenone, 2-hydroxy-4-octylbenzophenone, 4-dodecyloxy-2-hydroxybenzophenone, 4-benziloxy-2-hydroxybenzophenone, 2,2',4,4'-tetrahydroxybenzophenone, and 2,2'-dihydroxy-4,4'-dimethoxybenzophenone.

A benzoate-based ultraviolet absorbent includes 2,4-di-t-buthylphenyl-3',5'-di-t-buthyl-4-hydroxybenzoate.

A salicylate-based ultraviolet absorbent includes phenylsalicylate and 4-t-buthylphenylsalicylate.

A triazine-based ultraviolet absorbent includes 2-[4-[(2-hydroxy-3-dodecyloxypropyl)oxy]-2-hydroxyphenyl]-4,6-bis(2,4-dimethylphenyl) 1,3,5-triazine.

Commonly used ultraviolet absorbents are sold by several companies such as Sumitomo Chemical Co., Ltd., Kyodo Chemical Co., Ltd., Ciba Specialty Chemicals Inc., and Asahi Denka Co., Ltd., which are easily available. However, the present invention is not limited to these.

These ultraviolet absorbents are added at 0.1 to 20 wt %, preferably, at 0.5 to 5 wt % with respect to the quantity of the ultraviolet curable resin. The ultraviolet absorbent shields ultraviolet rays in ultraviolet irradiation in sealing to protect an organic light-emitting element. Although any of ultraviolet curable resins which transmit light in a region of visible light (400 to 800 nm) can be used for the sealing agent, a resin is preferable, to which a process such as curing is possible in a region of temperatures that do not damage characteristics of a light-emitting element.

For an ultraviolet-absorbent material, a porous material such as zaolite may be impregnated partially with an ultraviolet absorbent such as benzophenone. What "partially" means is that it is an object to absorb ultraviolet rays by a portion supporting benzophenone and adsorb entering moisture in the other holes. In order to make it easier to disperse fine powder, a surface modification may be conducted to zeolite, or an ultraviolet absorbent moiety may be introduced into a material that is used for a surface modification of zeolite.

Further, as the ultraviolet absorbent, deoxidizing materials such as fine particles of a metal such as iron and modified titanium dioxide, which are made to be ultraviolet-absorbent by a means such as the above-mentioned addition of an ultraviolet absorbent, may be used. By using these materials, oxygen can be absorbed as well as ultraviolet rays. Since the metal fine particles are used, a nanoparticle with a small particle size and the like are preferable not to lose transparency to visible light.

Embodiment Mode 3

Here, a sealing process will be described with reference to FIG. 1.

Figure 1A:
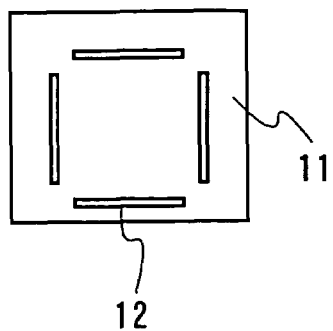
FIG. 1 is a diagram showing Embodiment Mode 3.
Figure 1B:
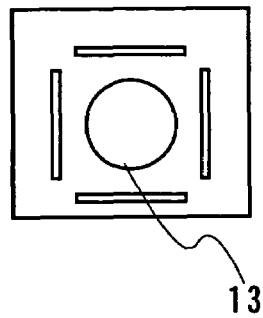

First, with a dispenser system, a first sealing agent 12 is formed in a prescribed position on a second substrate 11 in an atmosphere of inert gas (FIG. 1(A)). As the translucent first sealing agent 12, one that includes a filler (diameter: 6 μm to 24 μm) and has a viscosity of 370 Pa·s is used. Further, the first sealing agent 12 can be formed by printing since the first sealing agent 12 has a simple sealing pattern.

Next, a second sealing agent 13 is dropped in a region surrounded by the first sealing agent 12 (however, four corners are openings). (FIG. 1(B))

Figure 1C:
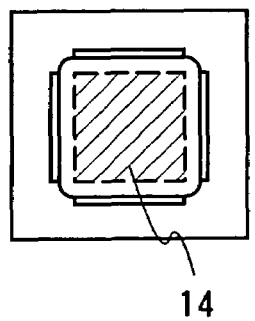
Figure 1D:
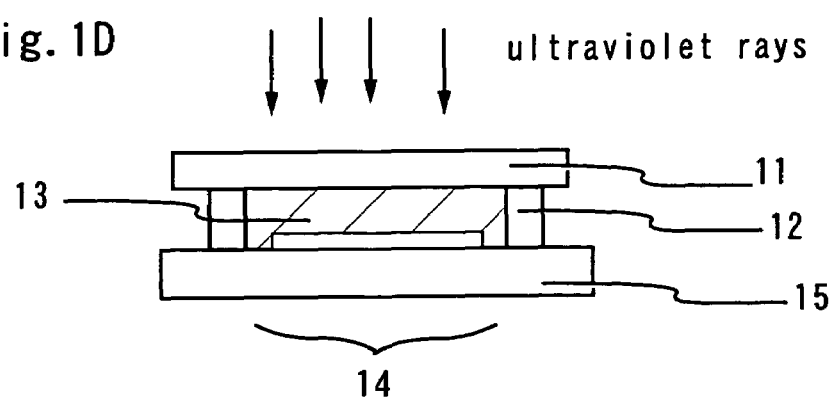

Next, a first substrate 15 that has a pixel portion 14 provided and the second substrate 11 that has the sealing agents (the first sealing agent 12 and the second sealing agent 13) provided are bonded (FIG. 1(C)). It is preferable that annealing is performed in vacuum to perform degassing just before the pair of substrates are bonded with the sealing agents. The second sealing agent 13 is extended for filling between parts of the first sealing agent 12. The shape and arrangement of the first sealing agent 12 makes it possible to fill with the second sealing agent 13 without an entry of air bubble. Then, ultraviolet irradiation is performed to cure the first sealing agent 12 and the second sealing agent 13. In addition to the ultraviolet irradiation, a heat treatment may be performed.

The present embodiment mode can be combined freely with the second sealing agent shown in Embodiment Mode 2.

Embodiment Mode 4

Figure 2A:
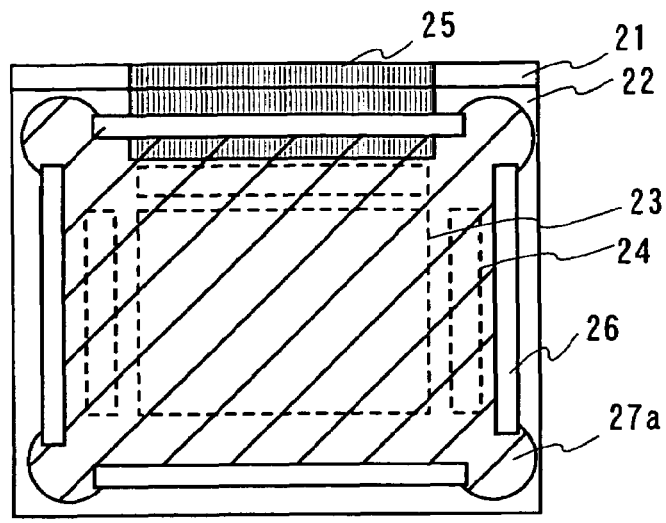
FIG. 2 is a diagram showing Embodiment Mode 4.

FIG. 2(A) is a top view of an active matrix light-emitting device according to an implementation of the present invention. The present invention is not limited to an active matrix light-emitting device, but can be applied to a simple matrix or segment light-emitting device or a light-emitting device of a panel light.

In FIG. 2(A), reference numeral 21 denotes a first substrate, reference numeral 22 denotes a second substrate, reference numeral 23 denotes a pixel portion, reference numeral 24 denotes a driver circuit portion, reference numeral 25 denotes a terminal area, reference numeral 26 denotes a first sealing agent, and reference numeral 27a denotes a second sealing agent.

Although the first substrate 21 has a material that is not particularly limited, it is preferable that the first substrate 21 and the second substrate 22 have the same thermal expansion coefficient since the second substrate 22 is bonded thereto. In the case of a top-emission structure, a semiconductor substrate or a metal substrate can be also used as a material of the first substrate 21. The first substrate 21 has the pixel portion 23 that has a plurality of organic light-emitting elements, the driver circuit portion 24, and the terminal area 25 provided.

Here, an example in which the first sealing agent 26 is arranged to surround the pixel portion 23 and the driver circuit portion 24 is shown. Also, one part of the first sealing agent 26 is partially overlapped with the terminal area 25 (or a wiring extended from a terminal electrode). In addition, a gap material for keeping a distance between the pair of substrates is included in the first sealing agent 26. Since the gap material is included, it is preferable that the first sealing agent 26 and an element (such as a TFT) are not overlapped not to generate short or the like in the case where a certain load is applied. Further, the first sealing agent 26 has a top surface in a linear shape, and has openings at four corners. In other words, a pair of two parts of the first sealing agent 26 arranged parallel in the X direction with the pixel portion 23 interposed in between and another pair of the other two parts of the first sealing agent 26 arranged parallel in the Y direction with the pixel portion 23 interposed in between, the four are arranged in total.

Further, filling with at least the second sealing agent 27 is performed between the pair of parts of the first sealing agent 26. The pair of substrates are fixed by the first sealing agent 26 arranged to surround the pixel portion 23 and the second sealing agent 27a in contact with the first sealing agent while covering the pixel portion.

In addition, the second sealing agent 27a is made to be a transparent and colorless material, and is more transparency than the first sealing agent 26 since no gap material is included. This second sealing agent 27a is exposed at each gap of the first sealing agent 26, that is, at each opening, and the second sealing agent 27 has a top surface with a exposed rim in a curved shape.

Figure 3A:
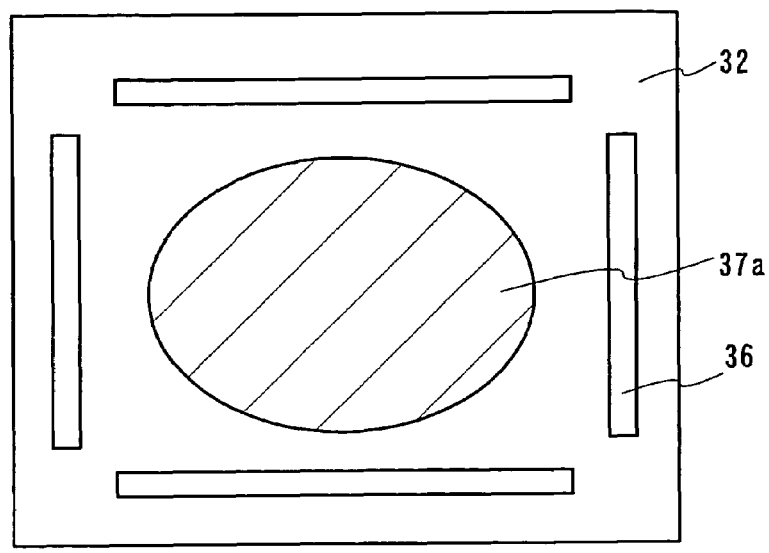
FIG. 3 is a diagram showing Embodiment Mode 3.

The mechanism of the second sealing agent 27a becoming the shape shown in FIG. 2(A) will be described below with reference to FIG. 3. FIG. 3(A) shows an example of a top view of a sealing substrate (a second substrate 32) before being bonded. FIG. 3(A) shows an example of forming a light-emitting device that has one pixel portion from one substrate.

First, after a dispenser is used to form four first sealing agents 36 on the second substrate 32, a second sealing agent 37a that has a lower viscosity than the first sealing agent 36 is dropped. A top view of a state after dropping corresponds to FIG. 3(A).

Figure 3B:
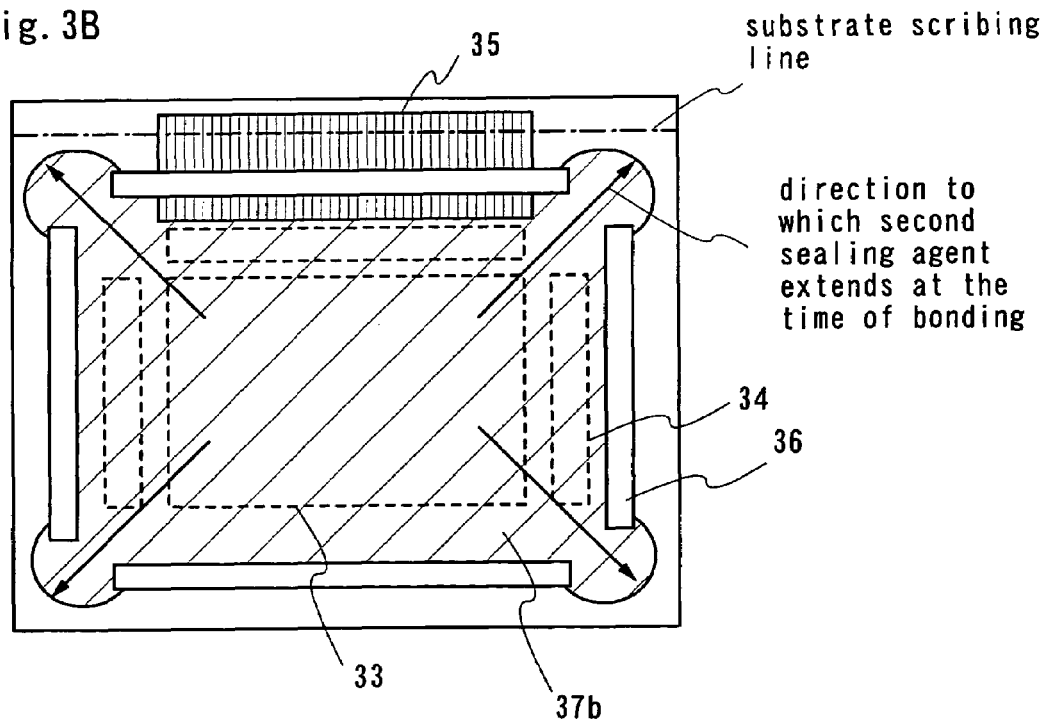

Next, a first substrate that has a pixel portion 33 having an organic light emitting element, a driver circuit portion 34, and a terminal area 35 provided is bonded. FIG. 3(B) shows a top view just after bonding the pair of substrates. While the first sealing agent is hardly extended when bonded since the viscosity of the first sealing agent is higher, the second sealing agent is extended in two dimensions as shown in FIG. 3(B) when bonded since the viscosity of the second sealing agent is lower. By the second sealing agent 37a pushed between the first sealing agents 36, that is, toward the opening in the direction of an arrow in FIG. 3(B), an air bubble can be prevented from existing in a filled region between the first sealing agents 36. The first sealing agents 36 are not mixed with the extended second sealing agent 37b in contact with the first sealing agents 36, and have a viscosity enough to make the position thereof unchanged by the second sealing agent 37a.

In FIG. 3(B), the second sealing agent 37b is exposed at the openings, and the exposed rim of the second sealing agent 37b is projected from the openings. By projecting from the openings, a distance between the air and the pixel portion can be increased, and further, blocking of oxygen or moisture can be realized. In addition, a bonding strength is also increased since a total bonding area is also increased. Besides, the rim of the second sealing agent 37a is curved at the openings.

Although an example in which the first substrate is bonded after forming the first sealing agent or the second sealing agent on the second substrate 32 is shown here, there is no particular limitation. The first sealing agent 36 or the second sealing agent 37b may be formed on the first substrate that has the organic light-emitting element formed.

Next, heat treatment or ultraviolet irradiation is performed to cure the first sealing agent 36 and the second sealing agent 37b.

According to the procedures shown above, the shape of the second sealing agent 27a shown in FIG. 2(A) can be obtained.

Although FIG. 2(A) shows an example of the second sealing agent 27a projecting from the openings, various shapes are available by changing the viscosity, the amount, or the material of the second sealing agent appropriately.

Figure 2B:
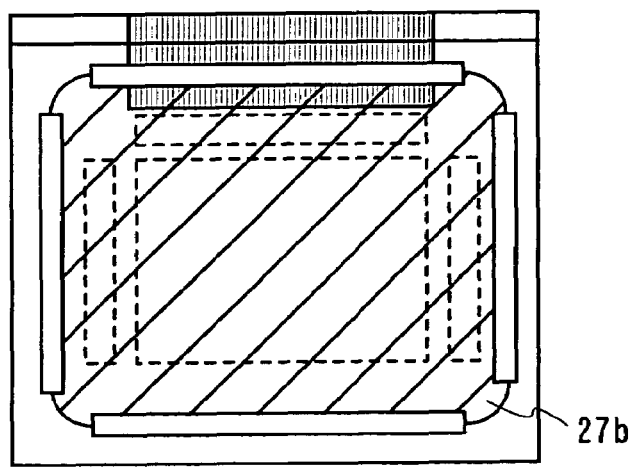

For example, as shown in FIG. 2(B), the second sealing agent 27b may be exposed at the openings to curve the exposed rim of the second sealing agent 27b. In FIG. 2(B), the second sealing agent 27b is not projected from the openings, but has a shape in which the gaps of the first sealing agent 26 is filled with the rim of the second sealing agent 27b just drawing an arc.

Figure 2C:
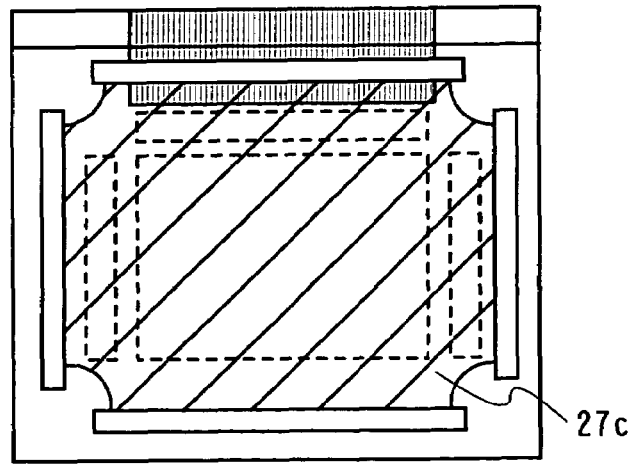

In addition, as shown in FIG. 2(C), the second sealing agent 27c may be exposed at the openings to have a shape in which the exposed rim of the second sealing agent 27c is concave and curved from the openings.

Besides, the shape of the first sealing agent 26 is not limited to being linear as long as the first sealing agent 26 is symmetrical and the parts thereof are arranged symmetrically with the pixel portion 23 interposed in between. When bonded, the shape of the first sealing agent 26 may be curved slightly so that the second sealing agent 27b that has a lower viscosity is easily extended.

The present embodiment mode can be combined freely with Embodiment Mode 2 and Embodiment Mode 3.

Embodiment Mode 5

FIG. 4 shows a portion of a sectional structure in a pixel portion according to the present invention.

Figure 4A:
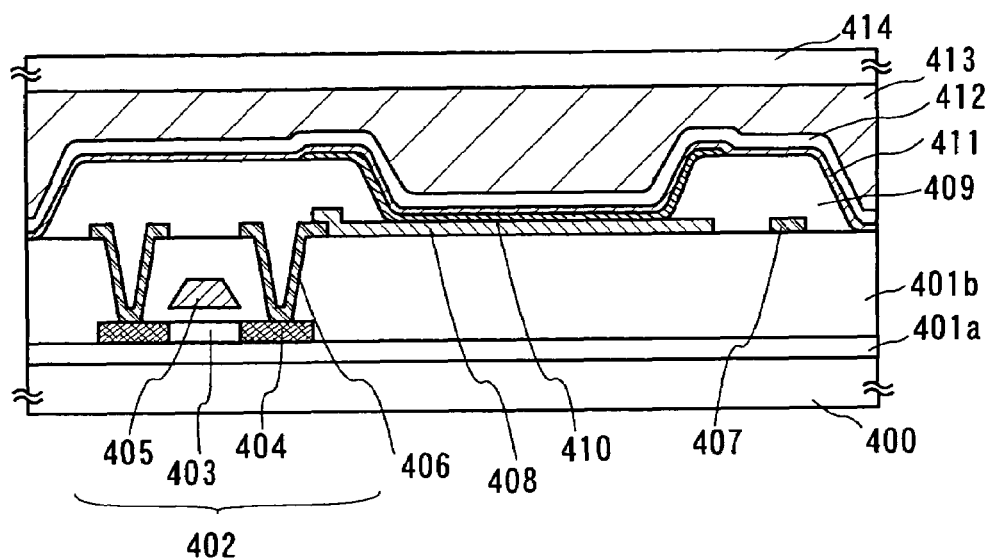
FIG. 4 is a diagram showing Embodiment Mode 5.

In FIG. 4(A), reference numeral 400 denotes a first substrate, reference numerals 401a and 401b are insulating layers, reference numeral 402 denotes a TFT, reference numeral 408 denotes a first electrode, reference numeral 409 denotes an insulator, reference numeral 410 denotes an organic light-emitting layer, reference numeral 411 denotes a second electrode, reference numeral 412 denotes a transparent protective layer, reference numeral 413 denotes a second sealing agent, and reference numeral 414 denotes a second substrate.

The TFT (p-channel TFT) 402 provided over the first substrate 400 is an element that controls electric current flowing to the organic light-emitting layer 410, and reference numeral 404 denotes a drain region (or a source region). In addition, reference numeral 406 is a drain electrode (or a source electrode) connecting the first electrode 408 and the drain region (or the source region) 404. Further, a wiring 407 such as a power supply line or a source wiring is also formed at the same time in the same process as that of the drain electrode 406. Here, an example of forming the first electrode 408 and the drain electrode 406 separately is shown, which however may be the same. The insulating layer 401a that serves as a base insulating film (here, a lower layer thereof is a nitride insulating film and an upper layer thereof is a oxide insulating film) is formed on the first substrate 400, and a gate insulating film is provided between a gate electrode 405 and an active layer. In addition the reference numeral 401b denotes an interlayer insulating film comprising an organic material or an inorganic material. Further, although not shown in the here, one or plural TFTs (an n-channel TFT or a p-channel TFT) are additionally provided in one pixel. Furthermore, although the TFT that has one channel formation region 403 is shown here, there is no particular limitation. A TFT that has a plurality of channels may be employed.

In addition, the reference numeral 408 denotes the first electrode, that is, an anode (or a cathode) of an organic light-emitting element. As a material of the first electrode 408, Ti, TiN, $TiSi_xN_y$, Ni, W, $WSi_x$, $WN_x$, $WSi_xN_y$, NbN, Mo, Cr, Pt, or an element selected from Zn, Sn, In, and Mo may be used. Further, as for a film thickness of the anode, a film including an alloy material or a compound material as its main component, which includes the material (those) as its main component, or a lamination film of those may be used in the range of a total film thickness from 100 nm to 800 nm. Here, a titanium nitride film is used as the first electrode 408. In the case of using a titanium nitride film as the first electrode 408, it is preferable that ultraviolet irradiation or plasma treatment using chlorine gas is performed to a surface thereof to increase a work function.

Further, there is an insulator 409 (referred to as a bank, a partition, a barrier, or an embankment) covering an edge portion of the first electrode 408 (and the wiring 407). As the insulator 409, an inorganic material (such as silicon oxide, silicon nitride, or silicon oxynitride), a photosensitive or non-photosensitive organic material (polyimide, acrylic, polyamide, polyimideamide, resist or benzocyclobutene), or lamination layer of those can be used. Here, a photosensitive organic resin covered with a silicon nitride film is used. In the case of using positive photosensitive acrylic as a material of an organic resin, for example, it is preferable to make only a top portion of the insulator have a curved surface with a curvature radius. In addition, as the insulator, any of photosensitive negative type that becomes insoluble in an etchant by light and positive type that becomes soluble in an etchant by light can be used.

Further, the organic light-emitting layer 410 is formed by using evaporation method or application method. In order to improve reliability, it is preferable that vacuum heating is performed for degassing before forming the organic light-emitting layer 410. In the case of using evaporation method, for example, evaporation is performed in a deposition chamber evacuated into vacuum at $5 \times 10^{-3}$ Torr (0.665 Pa) or less, preferably, $10^{-4}$ to $10^{-6}$ Pa. In the evaporation, an organic compound is in advance vaporized by resistance heating to fly toward the direction of the substrate by opening a shutter during the evaporation. The vaporized organic compound flies upward to be deposited to the substrate through an opening provided for a metal mask.

Besides, in the case of forming the organic light-emitting layer 410 by application using spin coating, baking by vacuum heating is preferable after application. For example, a solution of poly(ethylenedioxythiophene)/poly(styrene sulfonate) (PEDOT/PSS) that acts as a hole injection layer may be applied to the whole area, followed by baking, and then, a solution of polyvinyl carbazole (PVK) doped with an emission center dye (such as 1,1,4,4-tetraphenyl-1,3-butadiene (TPB), 4-dicyanomethylene-2-methyl-6-(p-dimethylaminostyryl)-4H pyran (DCM1), Nile Red, or coumarine 6), which acts as a light-emitting layer, may be applied to the whole area, followed by baking. The PEDOT/PSS is used with water as a solvent, which is insoluble in an organic solvent. Therefore, also in the case of applying the PVK thereon, it is not necessary to worry about dissolving again. In addition, it is preferable not to use the same deposition chamber since the PEDOT/PSS and the PVK have different solvents. Further, it is also possible to make the organic light-emitting layer as a single layer. An electron transport 1,3,4-oxadiazole derivative (PBD) may be dispersed into hole transport polyvinyl carbazole (PVK). Furthermore, white light emission can be obtained by dispersing PBD as an electron transport agent at 30 wt % and dispersing appropriated doses of four kinds of dyes (TPB, coumarine 6, DCM1. and Nile Red).

In addition, the reference numeral 411 denotes the second electrode comprising a conductive film, that is, a cathode (or an anode) of the organic light-emitting element. As a material of the second electrode 411, an alloy such as MgAg, MgIn, AlLi, $CaF_2$, or CaN, or a film with transparency obtained by depositing an element belonging to Group 1 or Group 2 of the periodic table and aluminum by co-evaporation method to be a thin film thickness, may be used. Here, an aluminum film from 1 nm to 10 nm or an aluminum film including a slight amount of Li is used since a top-emission structure is used where light is taken out through the second electrode 411. When a structure in which an Al film is used as the second electrode 411 is used, it becomes possible to form a material in contact with the organic light-emitting layer of a material except for oxide, and reliability of a light-emitting device can be improved. Further, a layer with transparency comprising $CaF_2$, $MgF_2$, or $BaF_2$ (a film thickness from 1 nm to 5 nm) may be formed as a cathode buffer layer before forming an aluminum film from 1 nm to 10 nm.

Further, in order to lower resistance of the cathode, an auxiliary electrode may be provided on a region of the second electrode 411 not to serve as a light-emitting region. In addition, resistance heating method by evaporation is used in forming the cathode, and an evaporation mask may be used for forming selectively.

Further, the reference numeral 412 denotes the transparent protective layer formed by evaporation, which protects the second electrode 411 comprising a metal thin film. Furthermore, the transparent protective layer 412 is covered with the second sealing agent 413. Since the second electrode 411 is a very thin metal film, oxidation and the like are easily generated with contact with oxygen, and there is a threat of reacting with a solvent and the like included in the sealing agent to change in quality. By covering the foregoing second electrode 411 comprising the metal thin film with the transparent protective layer 412, for example, $CaF_2$, $MgF_2$, or $BaF_2$, the second electrode 411 is prevented from reacting with a component such as a solvent included in the second sealing agent 413, and oxygen or moisture is effectively blocked without using a desiccant. Further, $CaF_2$, $MgF_2$, or $BaF_2$ can be formed by evaporation method, and by forming the second electrode 411 and the transparent protective layer 412 continuously by evaporation method, a surface of the electrode can be prevented from coming in contact with air while interfusion of an impurity can be prevented. In addition, when evaporation is used, the transparent protective film 412 can be formed under the condition that the organic light-emitting layer 410 is hardly damaged. Besides, the second electrode 411 may be further protected by providing layers with transparency comprising $CaF_2$, $MgF_2$, or $BaF_2$ to interpose the second electrode 411 in between.

Further, by using a metal without an oxygen atom in a material itself (a material that has a large work function), for example, a titanium nitride film, as the first electrode 408, using a metal without an oxygen atom in a material itself (a material that has a small work function), for example, an aluminum thin film, as the second electrode 411, and further covering with $CaF_2$, $MgF_2$, or $BaF_2$, a region between the first electrode 408 and the second electrode 411 can be kept an oxygen-free state next to zero.

In addition, it is the second sealing agent 413 that the second substrate 414 and the first substrate 400 are bonded with, in accordance with the method shown in Embodiment Mode 1. As the second sealing agent 413, the material shown in Embodiment Mode 2 is used.

Figure 4B:
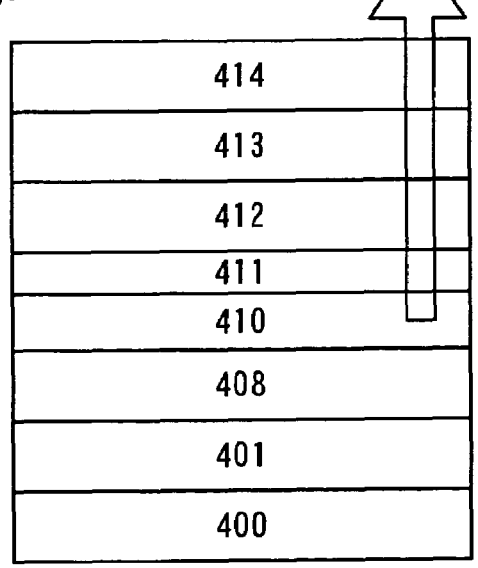

Further, FIG. 4(B) shows a simplified laminated structure in a light-emitting region in FIG. 4(A). The insulating layers 401*a* and 401*b* are collectively denoted as reference numeral 401. Light is emitted in the directions of arrows shown in FIG. 4(B).

Figure 4C:
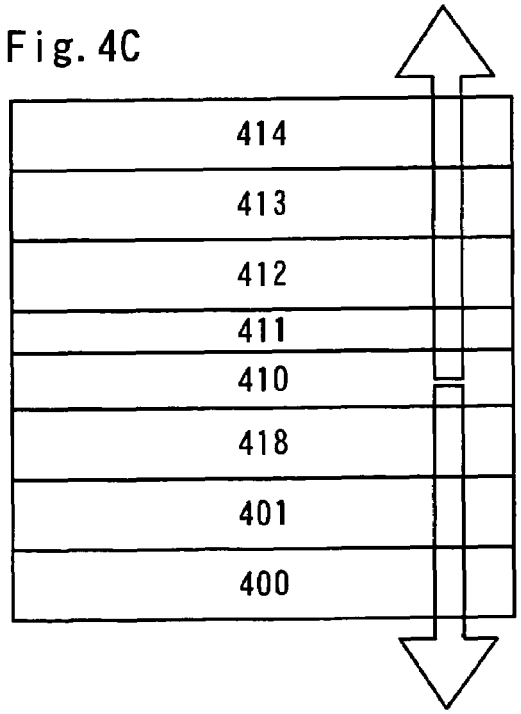

Further, in the case of using a first electrode 418 comprising a transparent conductive film as shown in FIG. 4(C) instead of the first electrode 408 comprising a metal layer, light can be emitted to both of the top surface and the bottom surface. As the transparent conductive film, ITO (an alloy of indium oxide and tin oxide), an alloy of indium oxide and zinc oxide ($In_2O_3$—ZnO), zinc oxide (ZnO) or the like may be used.

The present embodiment mode can be combined freely with Embodiment Mode 2, Embodiment Mode 3, and Embodiment Mode 4.

EMBODIMENTS

Embodiment 1

In the present embodiment, procedures of manufacturing a second sealing agent of an ultraviolet absorbent dispersed in an ultraviolet curable resin will be described. It is that the second sealing agent 413 in FIG. 4 that the second substrate 414 and the first substrate 400 are bonded with, in accordance with the method shown in Embodiment Mode.

The ultraviolet curable resin that is used for the second sealing agent 413 is not particularly limited as long as a material with transparency is used, and an ultraviolet curable epoxy resin or an ultraviolet and thermal curable epoxy resin may be typically used. Here, a highly heat-resistant ultraviolet curable epoxy resin (from Electro-Lite Corporation: 2500 Clear) is used, which has a refractive index of 1.5, a viscosity of 500 cps, a Shore D hardness of 90, a tensile strength 3000 psi, a Tg point of 150° C., a volume resistivity of $1 \times 10^{15}$ Ω·cm, and a withstand voltage of 450 V/mil.

2-(2'-hydroxy-5'-t-octylphenyl) benzotriazole [Product Name TINUBIN 329 (from Chiba·Specialty·Chemicals Inc.)] that is an ultraviolet absorbent is added to the foregoing ultraviolet curable resin at 3 wt %, and dispersed for 5 minutes at a mixing mode and 3 minutes at a de-foaming mode with a rotating and revolving type mixer [Product Name Mixer·Awatori-Rentaro (AR-250) (from Thinky Corp.)].

Embodiment 2

In the present embodiment, a light-emitting device according to the present invention will be described with reference to FIG. 5. FIG. 5(A) is a top view showing the light-emitting device and FIG. 5(B) is a sectional view of FIG. 5(A) cut along A-A'. Reference numeral 501 indicated by a dotted line denotes a driver circuit portion (a source side driver circuit), reference numeral 502 denotes a pixel portion, and reference numeral 503 denotes a driver circuit portion (a gate side driver circuit). In addition, reference numeral 504 denotes a sealing substrate and 505 denotes a first sealing agent. The inside surrounded by the first sealing agent 505 is filled with a second sealing agent 507.

Reference numeral 508 denotes a wiring for transmitting signals to be input to the source side driver circuit 501 and the gate side driver circuit 503, and receives a video signal, a clock signal, a start signal, a reset signal, and the like from FPC (Flexible Printed Circuit) 509 that serves as an external input terminal. Though only the FPC is shown in the figure here, a printed wiring board (PWB) may be attached to the FPC. A light-emitting device in the specification includes not only a light-emitting device body but also a state where an FPC or a PWB is attached thereto.

Next, the sectional structure will be explained with reference to FIG. 5(B). The driver circuits and the pixel portion are formed over a device substrate (a first substrate) 510. Here, the source side driver circuit 501 as the driver circuit portion and the pixel portion 502 are shown.

In the source side driver circuit 501, a CMOS circuit is formed of a combination of an n-channel TFT 523 and a p-channel TFT 524. The TFTs forming the driver circuit may also be formed of a known CMOS circuit, PMOS circuit, or NMOS circuit. Although the present embodiment shows a driver integrated type in which a driver circuit is formed over a substrate, which is not always necessary, the driver circuit can be formed not on the device substrate but at the outside thereof.

The pixel portion 502 is formed of a plurality of pixels, each including a switching TFT 511, a current controlling TFT 512, and a first electrode 513 connected to a drain thereof electrically. In addition, an insulator 514 is formed to cover an edge of the first electrode 513. Here, a positive photosensitive acrylic resin film is used to form the insulator 514.

Besides, in order for a film to be formed on the insulator 514 to have a favorable coverage, the insulator 514 has a top portion or bottom potion formed with a curved surface with a curvature. For example, in the case of using positive photosensitive acrylic as a material of the insulator 514, it is preferable that only the top portion of the insulator 514 has a curved surface with a curvature radius (0.2 μm to 3 μm). In addition, any of a photosensitive negative type that becomes insoluble in an etchant by light and a positive type that becomes soluble in an etchant by light can be used as the insulator 514.

On the first electrode 513, an organic light-emitting layer 515 and a second electrode 516 are respectively formed. Here, as a material that is used for the first electrode 513 functioning as an anode, it is preferable to use a material that has a large work function. For example, in addition to single layers such as an ITO (indium tin oxide) film, an indium zinc oxide (IZO) film, a titanium nitride film, a chromium film, a tungsten film, a Zn film, and a Pt film, a laminate of a titanium nitride film and a film including aluminum as its main component, a three-layer structure of a titanium nitride film, a film including aluminum as its main component, and a titanium nitride film, and the like can be used. When a laminated structure is employed, the resistance as a wiring is low, favorable ohmic contact can be taken, and it is possible to function as an anode.

Further, the organic light-emitting layer 515 is formed by evaporation method that uses an evaporation mask or by inkjet. For the organic light-emitting layer 515, as a part thereof, a phosphorescent compound is used, and as the other materials that can be used in combination, a low molecular weight material and a high molecular weight material may be given. In addition, it is often the case that an organic compound for a single layer or a laminate is generally used as a material that is used for an organic light-emitting layer. However, the present invention includes a structure in which an inorganic compound is used for a part of a film comprising an organic compound.

In addition, as a material that is used for the second electrode (cathode) 516 formed on the organic light-emitting layer 516, a material that has a small work function (Al, Ag, Li, or Ca, an alloy thereof such as MgAg, MgIn, AlLi, or $CaF_2$, or CaN) may be used. In the case of transmitting light generated in the organic light-emitting layer 516 through the second electrode 516, it is preferable to use a laminate of a thinned metal and a transparent conductive film (such as ITO (an alloy of indium oxide and tin oxide), an alloy of indium oxide and zinc oxide ($In_2O_3$—ZnO), or zinc oxide (ZnO)) film as the second electrode (cathode) 516.

Further, a structure is obtained by bonding the sealing substrate (second substrate) 504 and the device substrate 510 with the first sealing agent 505, where an organic light-emitting element 518 is equipped in the space surrounded by the device substrate 510, the sealing substrate 504, and the first sealing agent 505. For the space surrounded by the device substrate 510, the sealing substrate 504, and the first sealing agent 505, the second sealing agent 507 adjusted as shown in Embodiment Mode 1 is used.

Since the second electrode 516 is a very thin metal film, oxidation and the like are easily generated with contact with oxygen, and there is a threat of reacting with a solvent and the like included in the sealing agent to change in quality. By covering the foregoing second electrode 516 comprising the metal thin film with a transparent protective layer 517, for example, $CaF_2$, $MgF_2$, or $BaF_2$, the second electrode 516 is prevented from reacting with a component such as a solvent included in the second sealing agent 507.

It is preferable to use epoxy resin for the first sealing agent 505. In addition, it is desirable that these materials are a material that allows no permeation of moisture or oxygen to as much as possible. Further, as a material that is used for the sealing substrate 504, a plastic substrate comprising FRP (Fiberglass-Reinforced Plastics), PVF (polyvinylfluoride), Mylar, polyester, acrylic, or the like can be used besides a glass substrate and a quarts substrate.

In this way, the light-emitting device according to the present invention can be obtained.

Embodiment 3

In the present embodiment, an example manufacturing a light-emitting device according to the present invention and a sealing process thereof will be shown.

A substrate that with a patterned first electrode is put into a resistance-heating deposition system, and respective organic layers of a hole injection layer, a hole transport layer, and a light-emitting layer, and a cathode (transparent) that is a second electrode are sequentially deposited by vacuum evaporation method. In the deposition, pressure in the vacuum evaporation system has a degree of vacuum of $1.0 \times 10^{-4}$ Pa or more. For the hole injection layer, copper phthalocyanine (CuPc) is deposited to be a thickness of 10 nm. For the hole transport layer, bis(N-naphtyl)-N-phenylbenzidine (α-NPD) is deposited to be a thickness of 20 nm. As the light-emitting layer, 8-Aluminum Quinolinol ($Alq_3$) is deposited to be a thickness of 50 nm. As the cathode, an alloy of magnesium and silver (Mg:Ag) is used. For the Mg:Ag, a deposition rate is controlled for the mixing ratio of Mg to Ag to be 10:1, a thickness of 10 nm is deposited. In the deposition by vacuum evaporation method, boats for evaporation are filled respectively with the organic materials on the order of 0.2 g, and boats for evaporation are filled with Mg on the order of 0.1 g and Ag on the order of 0.4 g similarly, which are attached to an electrode in the vacuum evaporation system. Then, a voltage is applied sequentially to each of the boats for evaporation at a degree of vacuum of $1.0 \times 10^{-4}$ Pa or more to perform deposition.

In a dried nitrogen atmosphere at a dew point of −80° C. or less in a glove box, the obtained organic light-emitting element substrate is bonded to a second substrate with a sealing agent arranged in accordance with Embodiment Mode 3. After that, ultraviolet rays (3000 mJ/365 nm) is irradiated from the second substrate side to cure the sealing agent.

Embodiment 4

In the present embodiment, various electronic equipments completed with the use of a light-emitting device that has an organic light-emitting element according to the present invention will be described.

As electronic equipments manufactured with the use of a light-emitting device that has an organic light-emitting element according to the present invention, a video camera, a digital camera, a goggle-type display (head mount display), a navigation system, a sound reproduction device (such as an in-car audio system or an audio set), a laptop personal computer, a game machine, a personal digital assistance (such as a mobile computer, a mobile phone, a portable game machine, or an electronic book), an image reproduction device equipped with a recording medium (specifically, a device equipped with a display device that can reproduce a recording medium such as a digital versatile disc (DVD) and display the image), and the like can be given. FIG. 6 shows specific examples of these electronic devices.

Figure 6A:
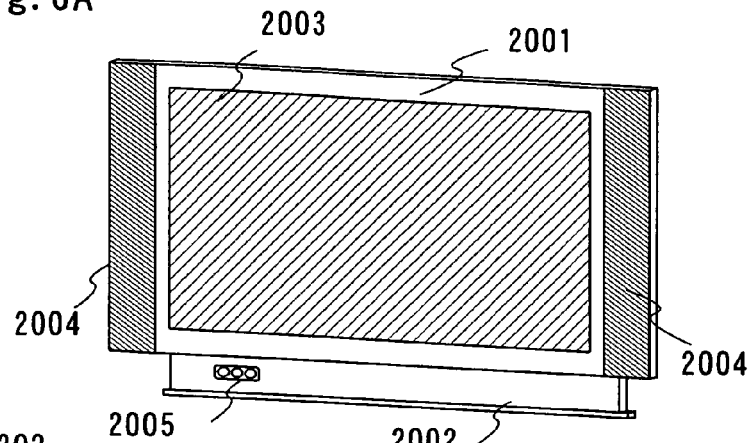
FIG. 6 is a diagram showing one example of electronic devices in Embodiment 4.

FIG. 6(A) is a display device, which includes a frame body 2001, a support 2002, a display portion 2003, a speaker portion 2004, a video input terminal 2005, and the like. A light-emitting device that has an electroluminescent device according to the present invention is used for the display portion 2003 to manufacture the display device. The display device includes all devices for displaying information such as for a personal computer, for receiving TV broad casting, and for displaying an advertisement.

Figure 6B:
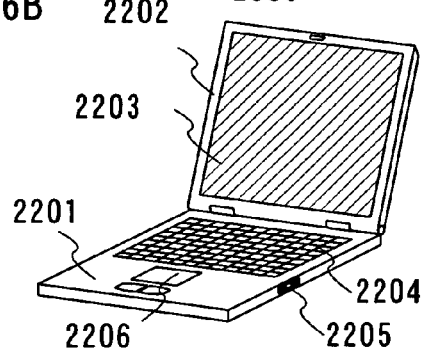

FIG. 6(B) is a laptop personal computer, which includes a main body 2201, a frame body 2202, a display portion 2203, a keyboard 2204, an external connection port 2205, a pointing mouse 2206, and the like. A light-emitting device that has an organic light-emitting element according to the present invention is used for the display portion 2203 to manufacture the laptop personal computer.

Figure 6C:
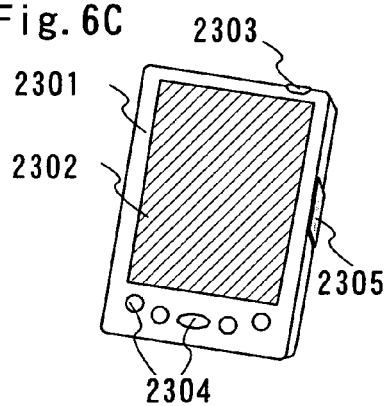

FIG. 6(C) is a mobile computer, which includes a main body 2301, a display portion 2302, a switch 2303, an operation key 2304, an infrared port 2305, and the like. A light-emitting device that has an organic light-emitting element according to the present invention is used for the display portion 2302 to manufacture the mobile computer.

Figure 6D:
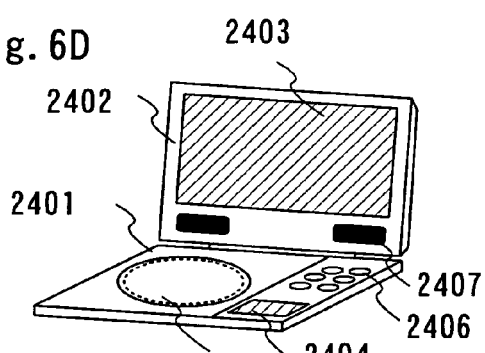

FIG. 6(D) is a portable image reproduction device equipped with a recording medium (specifically, a DVD reproduction device), which includes a main body 2401, a frame body 2402, a display portion A 2403, a display portion B 2404, a recording medium (such as DVD) reading portion 2405, an operation key 2406, a speaker portion 2407, and the like. The display portion A 2403 is used mainly for displaying image information while the display portion B 2404 is used mainly for displaying character information, and a light-emitting device that has an organic light-emitting element according to the present invention is used for these display portion A 2403 and display portion B 2404 to manufacture the portable image reproduction device equipped with the recording medium. The image reproduction device equipped with the recording medium further includes a home game machine and the like.

Figure 6E:
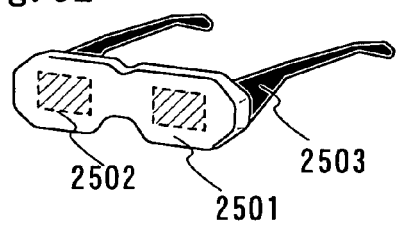

FIG. 6(E) is a goggle-type display (head mount display), which includes a main body 2501, a display portion 2502, an arm portion 2503, and the like. A light-emitting device that has an organic light-emitting element according to the present invention is used for the display portion 2502 to manufacture the goggle-type display.

Figure 6F:
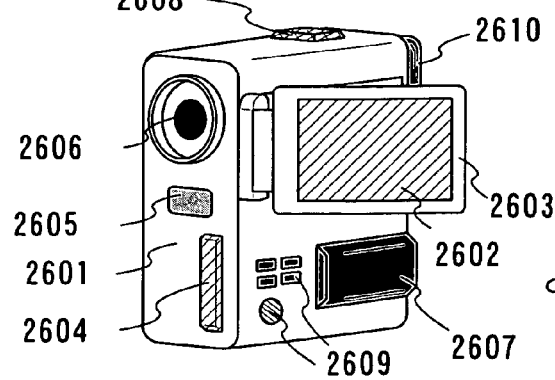

FIG. 6(F) is a video camera, which includes a main body 2601, a display portion 2602, a frame body 2603, an external connection port 2604, a remote control receiving portion 2605, an image receiving portion 2606, a battery 2607, a sound input portion 2608, an operation key 2609, an eye piece 2610, and the like. A light-emitting device that has an organic light-emitting element according to the present invention is used for the display portion 2602 to manufacture the video camera.

Figure 6G:
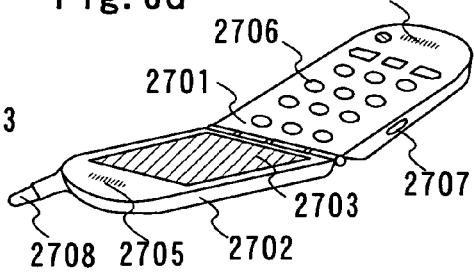

FIG. 6(G) is a mobile phone, which includes a main body 2701, a frame body 2702, a display portion 2703, a voice input portion 2704, a voice output portion 2705, an operation key 2706, an external connection port 2707, an antenna 2708, and the like. A light-emitting device that has an organic light-emitting element according to the present invention is used for the display portion 2703 to manufacture the mobile phone. The mobile phone can have power consumption suppressed by displaying white characters on a black background in the display portion 2703.

As described above, a light-emitting device that has an electroluminescent device according to the present invention is quite widely applied, and is applicable to electronic equipments in all fields.

The invention claimed is:
1. A light-emitting device comprising:
an organic light-emitting element of a sequential lamination of a first electrode provided in contact with an insulating surface of a first substrate, an organic light-emitting layer provided in contact with the first electrode and including an electroluminescent organic compound, and a transparent second electrode provided in contact with the organic light-emitting layer,
wherein the organic light-emitting element is provided between the first substrate and a transparent second substrate,
wherein a sealing agent comprising an ultraviolet curable resin and an ultraviolet absorbent is filled between the transparent second electrode and the second substrate,
wherein the ultraviolet absorbent is dispersed in the ultraviolet curable resin,
wherein the sealing agent has an absorbance of 1 or more to a wavelength of ultraviolet rays irradiated for curing the ultraviolet curable resin,
wherein the ultraviolet absorbent is moisture-adsorbent, and
wherein the ultraviolet absorbent has a material that absorbs the wavelength region of the ultraviolet rays, which is supported on a porous body.
2. The light-emitting device according to claim 1, wherein the wavelength of the ultraviolet rays is 200 nm or more and 400 nm or less.

3. The light-emitting device according to claim 1, wherein the ultraviolet absorbent is oxygen-absorbent.

4. The light-emitting device according to claim 1, wherein the ultraviolet absorbent is selected from the group consisting of benzotriazole-based, benzophenone-based, and salicylate-based compounds.

5. An electronic device having the light-emitting device according to claim 1, wherein said electronic device is selected from the group consisting of a display device, a laptop personal computer, a mobile computer, a portable image reproduction device, a sound reproduction device, a goggle-type display, a video camera, and a mobile phone.

6. The light-emitting device according to claim 1, wherein a thickness of the transparent second electrode is in a range of 1-10 nm.

7. A light-emitting device comprising:
an organic light-emitting element further comprising:
a first electrode over an insulating surface of a first substrate;
an organic light-emitting layer over the first electrode, said organic light-emitting layer comprising an electroluminescent organic compound;
a transparent second electrode over the organic light-emitting layer;
wherein the organic light-emitting element is between the first substrate and a transparent second substrate;
wherein a sealing agent comprising an ultraviolet curable resin and an ultraviolet absorbent is filled between the transparent second electrode and the second substrate,
wherein the ultraviolet absorbent is dispersed in the ultraviolet curable resin, and
wherein the sealing agent has an absorbance of 1 or more to a wavelength of ultraviolet rays irradiated for curing the ultraviolet curable resin,
wherein the ultraviolet absorbent is moisture-adsorbent, and
wherein the ultraviolet absorbent has a material that absorbs the wavelength region of the ultraviolet rays, which is supported on a porous body.

8. The light-emitting device according to claim 7, wherein the wavelength of the ultraviolet rays is 200 nm or more and 400 nm or less.

9. The light-emitting device according to claim 7, wherein the ultraviolet absorbent is oxygen-absorbent.

10. The light-emitting device according to claim 7, wherein the ultraviolet absorbent is selected from the group consisting of benzotriazole-based, benzophenone-based, and salicylate-based compounds.

11. An electronic device having the light-emitting device according to claim 7, wherein said electronic device is selected from the group consisting of a display device, a laptop personal computer, a mobile computer, a portable image reproduction device, a sound reproduction device, a goggle-type display, a video camera, and a mobile phone.

12. The light-emitting device according to claim 7, wherein a thickness of the transparent second electrode is in a range of 1-10 nm.

13. A light-emitting device comprising:
an organic light-emitting element of a sequential lamination of a first electrode provided in contact with an insulating surface of a first substrate, an organic light-emitting layer provided in contact with the first electrode and including an electroluminescent organic compound, and a transparent second electrode provided in contact with the organic light-emitting layer,
wherein the organic light-emitting element is provided between the first substrate and a transparent second substrate,
wherein a sealing agent comprising an ultraviolet curable resin and an ultraviolet absorbent is filled between the transparent second electrode and the second substrate,
wherein the ultraviolet absorbent is dispersed in the ultraviolet curable resin,
wherein the sealing agent has an absorbance of 1 or more to a wavelength of ultraviolet rays irradiated for curing the ultraviolet curable resin,
wherein the ultraviolet absorbent is moisture-adsorbent,
wherein the ultraviolet absorbent has a material that absorbs the wavelength region of the ultraviolet rays, which is supported on a porous body, and
wherein the porous body is zeolite.

14. A light-emitting device comprising:
an organic light-emitting element further comprising:
a first electrode over an insulating surface of a first substrate;
an organic light-emitting layer over the first electrode, said organic light-emitting layer comprising an electroluminescent organic compound;
a transparent second electrode over the organic light-emitting layer;
wherein the organic light-emitting element is between the first substrate and a transparent second substrate;
wherein a sealing agent comprising an ultraviolet curable resin and an ultraviolet absorbent is filled between the transparent second electrode and the second substrate,
wherein the ultraviolet absorbent is dispersed in the ultraviolet curable resin, and
wherein the sealing agent has an absorbance of 1 or more to a wavelength of ultraviolet rays irradiated for curing the ultraviolet curable resin,
wherein the ultraviolet absorbent is moisture-adsorbent,
wherein the ultraviolet absorbent has a material that absorbs the wavelength region of the ultraviolet rays, which is supported on a porous body, and
wherein the porous body is zeolite.

* * * * *